(12) United States Patent
Cheng et al.

(10) Patent No.: US 11,469,101 B2
(45) Date of Patent: Oct. 11, 2022

(54) SEMICONDUCTOR STRUCTURE AND MANUFACTURING METHOD THEREFOR

(71) Applicant: ENKRIS SEMICONDUCTOR, INC., Suzhou (CN)

(72) Inventors: Kai Cheng, Suzhou (CN); Kai Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 24 days.

(21) Appl. No.: 17/143,877

(22) Filed: Jan. 7, 2021

(65) Prior Publication Data

US 2021/0257214 A1    Aug. 19, 2021

Related U.S. Application Data

(63) Continuation of application No. PCT/CN2019/074396, filed on Feb. 1, 2019.

(51) Int. Cl.
*H01L 21/02* (2006.01)
*H01L 29/20* (2006.01)
(Continued)

(52) U.S. Cl.
CPC .... *H01L 21/02502* (2013.01); *H01L 21/0254* (2013.01); *H01L 21/02458* (2013.01);
(Continued)

(58) Field of Classification Search
None
See application file for complete search history.

(56) References Cited

U.S. PATENT DOCUMENTS

| | | | |
|---|---|---|---|
| 2012/0025203 A1 | 2/2012 | Nakata et al. | |
| 2017/0117404 A1* | 4/2017 | Era | H01L 29/7786 |
| 2017/0179271 A1* | 6/2017 | Fenwick | H01L 29/66462 |

FOREIGN PATENT DOCUMENTS

| | | |
|---|---|---|
| CN | 106158946 A | 11/2016 |
| CN | 107408511 A | 11/2017 |
| CN | 108807499 A | 11/2018 |

OTHER PUBLICATIONS

International Search Report in corresponding PCT Application No. PCT/CN2019/074396, dated Oct. 14, 2019.
(Continued)

*Primary Examiner* — Bo B Jang
(74) *Attorney, Agent, or Firm* — Westbridge IP LLC

(57) ABSTRACT

Embodiments of the present application provide a semiconductor structure and a manufacturing method therefor. A buffer layer is disposed on a substrate layer, and the buffer layer includes a first buffer layer and a second buffer layer. By doping a transition metal in the first buffer layer, a deep level trap may be formed to capture background electrons, and diffusion of free electrons toward the substrate may also be avoided. By decreasing a doping concentration of the transition metal in the second buffer layer, a tailing effect is avoided and current collapse is prevented. By doping periodically the impurity in the buffer layer, the impurity may be as an acceptor impurity to compensate the background electrons, and then a concentration of the background electrons is reduced. By using the periodic doping method, dislocations, caused by doping, in the buffer layer may be effectively reduced.

20 Claims, 7 Drawing Sheets

(51) Int. Cl.
*H01L 29/205* (2006.01)
*H01L 29/778* (2006.01)
*H01L 23/00* (2006.01)

(52) U.S. Cl.
CPC ........ *H01L 23/562* (2013.01); *H01L 29/2003* (2013.01); *H01L 29/205* (2013.01); *H01L 29/7786* (2013.01); *H01L 21/0242* (2013.01); *H01L 21/02378* (2013.01); *H01L 21/02381* (2013.01); *H01L 21/02389* (2013.01)

(56) References Cited

OTHER PUBLICATIONS

Written Opinion in corresponding PCT Application No. PCT/CN2019/074396, dated Oct. 14, 2019.

\* cited by examiner

SEMICONDUCTOR STRUCTURE AND MANUFACTURING METHOD THEREFOR

CROSS-REFERENCE TO RELATED APPLICATIONS

The present application is a continuation of International Application No. PCT/CN2019/074396 filed on Feb. 1, 2019, the entire contents of which are incorporated herein by reference.

TECHNICAL FIELD

Embodiments of the present application relate to the field of microelectronic technologies, in particular to a semiconductor structure and a manufacturing method therefor.

BACKGROUND

High Electron Mobility Transistor (HEMT) is a kind of heterojunction field effect transistor. Taking AlGaN/GaN HEMT as an example, since a band gap of AlGaN is greater than that of GaN, two-Dimensional Electron Gas (2DEG) is formed at an interface between AlGaN and GaN if a heterojunction is formed by AlGaN and GaN. Therefore, HEMT is also known as 2DEG field effect transistor.

As for GaN-based HEMTs, if other impurities or a transition metal such as iron is doped into a region located below the 2DEG, a pinch-off characteristic may be improved, or a cut-off voltage may be increased. However, electrons trapped by charge traps formed by an impurity may hinder formation of the 2DEG, thus being prone to current collapse. Although reducing a doping concentration of the impurity is beneficial to suppress the current collapse, the current collapse cannot be also eliminated if a thickness of a buffer layer is not adjusted accurately.

SUMMARY

In view of this, a semiconductor structure and a manufacturing method therefor are provided to suppress leakage current, improve a pinch-off characteristic of a device and avoid current collapse. Therefore, the leakage current of the device with the semiconductor structure may be balanced in dynamic characteristics.

A semiconductor structure is provided according to an embodiment of the present application. The semiconductor structure includes a substrate and a buffer layer disposed on the substrate. The buffer layer includes a first buffer layer and a second buffer layer upward from the substrate in turn. The first buffer layer is co-doped with a transition metal and an impurity. A doping concentration of the transition metal remains constant, and a doping concentration of the impurity is modulated periodically. A doping concentration of the transition metal is not less than a peak value of the doping concentration of the impurity in the first buffer layer. The second buffer layer is doped with the transition metal. A doping concentration of the transition metal in the second buffer layer is less than the doping concentration of the transition metal in the first buffer layer.

Further, in an embodiment of the present application, the doping concentration of the transition metal in the second buffer layer decreases along a direction away from the substrate.

Further, in an embodiment of the present application, the semiconductor structure further includes an impurity co-doped in the second buffer layer. The doping concentration of the transition metal is not less than a doping concentration of the impurity in an upper surface of the second buffer layer. The upper surface of the second buffer layer is a surface of the second buffer layer away from the substrate.

Further, in an embodiment of the present application, the semiconductor structure further includes a nucleating layer disposed between the substrate and the buffer layer.

A manufacturing method for a semiconductor structure is further provided in the present application. The manufacturing method includes providing a substrate and forming a buffer layer on the substrate. The buffer layer includes a first buffer layer and a second buffer layer upward from the substrate in turn. The first buffer layer is co-doped with a transition metal and an impurity. A doping concentration of the transition metal remains constant, and a doping concentration of the impurity is modulated periodically. The doping concentration of the transition metal is not less than a peak value of the doping concentration of the impurity in the first buffer layer. The second buffer layer is doped with the transition metal. The doping concentration of the transition metal in the second buffer layer is less than the doping concentration of the transition metal in the first buffer layer.

Further, in an embodiment of the present application, the doping concentration of the transition metal in the second buffer layer decreases along a direction away from the substrate.

Further, in an embodiment of the present application, the manufacturing method for the semiconductor structure further includes doping an impurity in the second buffer layer. The doping concentration of the transition metal is not less than a doping concentration of the impurity in an upper surface of the second buffer layer. The upper surface of the second buffer layer is a surface of the second buffer layer away from the substrate.

Further, in an embodiment of the present application, the manufacturing method for the semiconductor structure further includes forming a nucleating layer between the substrate and the buffer layer.

The present application provides the semiconductor structure and the manufacturing method therefor. The buffer layer is disposed on the substrate layer, and the buffer layer includes the first buffer layer and the second buffer layer. By doping the transition metal in the first buffer layer, a deep level trap may be formed to capture background electrons, and diffusion of free electrons toward the substrate may also be avoided. By decreasing the doping concentration of the transition metal in the second buffer layer, a tailing effect is avoided and current collapse is prevented. By doping periodically the impurity in the buffer layer, the impurity may be as an acceptor impurity to compensate the background electrons, and then a concentration of the background electrons is reduced. By using the periodic doping method, dislocations caused by doping, in the buffer layer may be effectively reduced.

DETAILED DESCRIPTION OF THE EMBODIMENTS

The present application will be described in detail below in combination with specific embodiments shown in drawings. However, the present application may not be limited by the embodiments. Changes in structure, method or function made by those skilled in the art based on the embodiments are all included in the protection scope of the present application.

In addition, repeated labels or marks may be used in different embodiments. These repetitions are only for describing the present application briefly and clearly, instead of representing any correlation between the different embodiments and/or structures.

Figure 1:
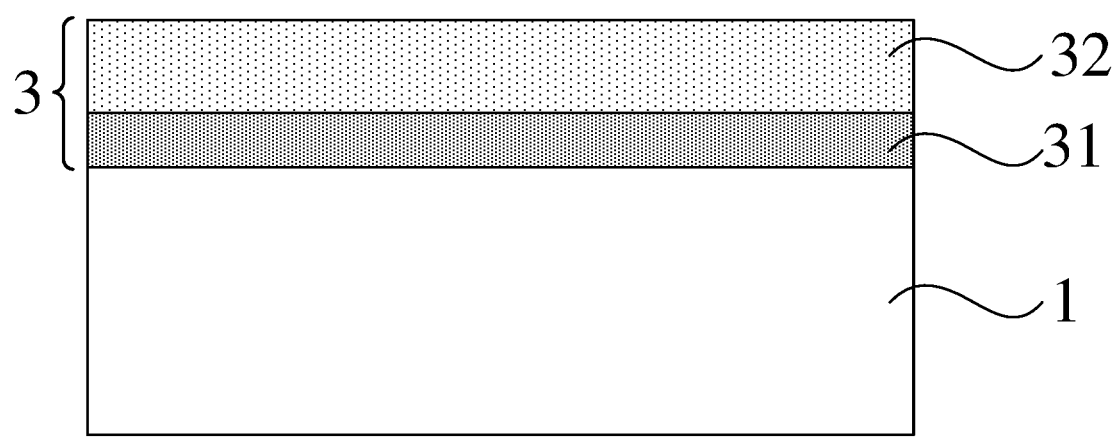
FIG. 1 shows a schematic structural diagram of a semiconductor structure according to an embodiment of the present application.

As shown in FIG. 1, a manufacturing method for a semiconductor structure includes providing a substrate 1 and forming a buffer layer 3 on the substrate 1. The buffer layer 3 includes a first buffer layer 31 and a second buffer layer 32 upward from the substrate in turn.

In the embodiment, the substrate 1 is made of at least one of semiconductor materials, ceramic materials and polymer materials. For example, the substrate 1 is made of at least one of sapphire, silicon carbide, silicon, lithium niobate, Silicon On Insulator (SOI), gallium nitride and aluminum nitride.

The first buffer layer 31 is co-doped with a transition metal and an impurity. A doping concentration of the transition metal remains constant, and a doping concentration of the impurity is periodically modulated.

In the embodiment, a peak value of the doping concentration of the impurity modulated periodically is not less than $1E17$ $cm^{-3}$, and a valley value is not greater than 50% of the peak value. For example, the valley value of the doping concentration of the impurity modulated periodically is not greater than $5E16$ $cm^{-3}$. Further, the valley value of the doping concentration of the impurity modulated periodically is not greater than $3E16$ $cm^{-3}$. The impurity, in the first buffer layer 31, is used as an acceptor impurity to compensate background electrons introduced by other impurities (such as oxygen). Additionally, growth conditions such as low pressure and low temperature are needed for achieving the high doping concentration of the impurity. However, a large number of dislocations may be introduced by the growth conditions. Therefore, the dislocations of the buffer layer may be effectively reduced by doping the impurity periodically.

Further, in the first buffer layer 31, the doping concentration of the transition metal is not less than the peak value of the doping concentration of the impurity. The transition metal forms a deep level trap in the buffer layer to capture the background electrons.

Further, the second buffer layer 32 is doped with a transition metal. A doping concentration of the transition metal in the second buffer layer 32 is less than the doping concentration of the transition metal in the first buffer layer 31.

Further, the doping concentration of the transition metal in the second buffer layer 32 decreases along a direction away from the substrate 1, so as to avoid a tailing effect caused by the transition metal and prevent current collapse. A minimum doping concentration of the transition metal in the second buffer layer 32 is not greater than $3E16$ $cm^{-3}$, otherwise a deep level trap formed due to the excessively high doping concentration of the transition metal may cause impurity scattering and reduce mobility.

Further, the semiconductor structure further includes an impurity doped in the second buffer layer 32. In an upper surface of the second buffer layer 32, the doping concentration of the transition metal is not less than a doping concentration of the impurity. The upper surface of the second buffer layer 32 refers to a surface of the second buffer layer 32 away from the substrate 1.

Further, the transition metal mentioned above includes at least one of Ti, Cr, Mn, Fe, Co, Ni, Cu, Zn, Mo, Ag and Cd, preferably, Fe. The impurity is C.

Further, a thickness of the first buffer layer 31 is 0.01 μm to 5 μm. A thickness of the second buffer layer 32 is 0.05 μm to 5 μm.

Figure 2A:
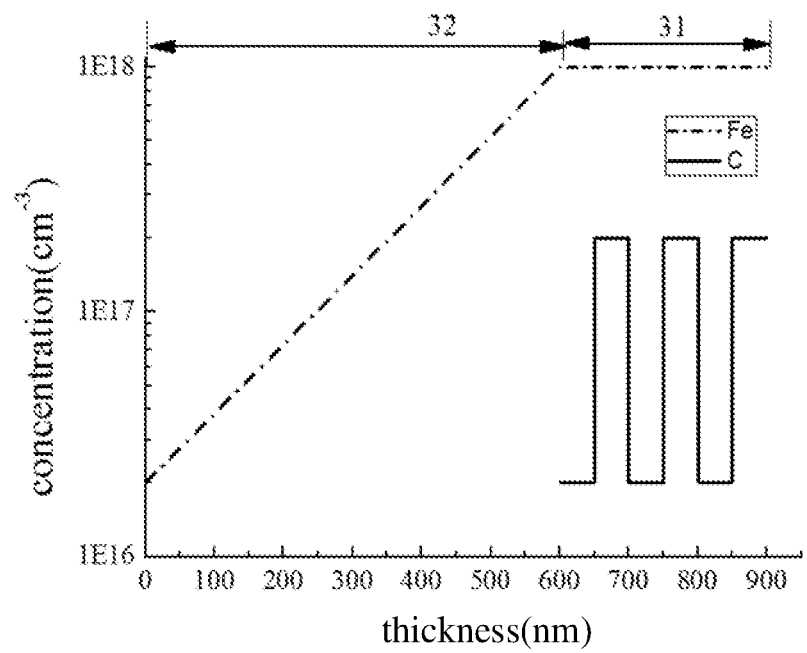
FIG. 2a-2h show doping modes of doping concentrations of a transition metal and an impurity changed relative to a thickness in a semiconductor structure according to the present application.

Specifically, as shown in FIG. 2a, a horizontal axis represents a thickness of the buffer layer 3. The upper surface of the second buffer layer 32 is taken as 0 nm, and the closer to the substrate, the greater the thickness value represented by the horizontal axis is. A vertical axis represents doping concentrations of doping atoms. In the embodiment, 0 nm to 600 nm in the horizontal axis refers to the second buffer layer 32, and 600 nm to 900 nm in the horizontal axis refers to the first buffer layer 31. The first buffer layer 31 is doped with a transition metal Fe and an impurity C. A doping concentration of Fe remains constant at $1E18$ $cm^{-3}$. A doping concentration of C is varied periodically, a peak value of the doping concentration of C is $2E17$ $cm^{-3}$, and a valley value of the doping concentration of C is $2E16$ $cm^{-3}$. The second buffer layer 32 is doped without C, and a doping concentration of Fe gradually decreases to $2E16$ $cm^{-3}$.

Figure 2B:
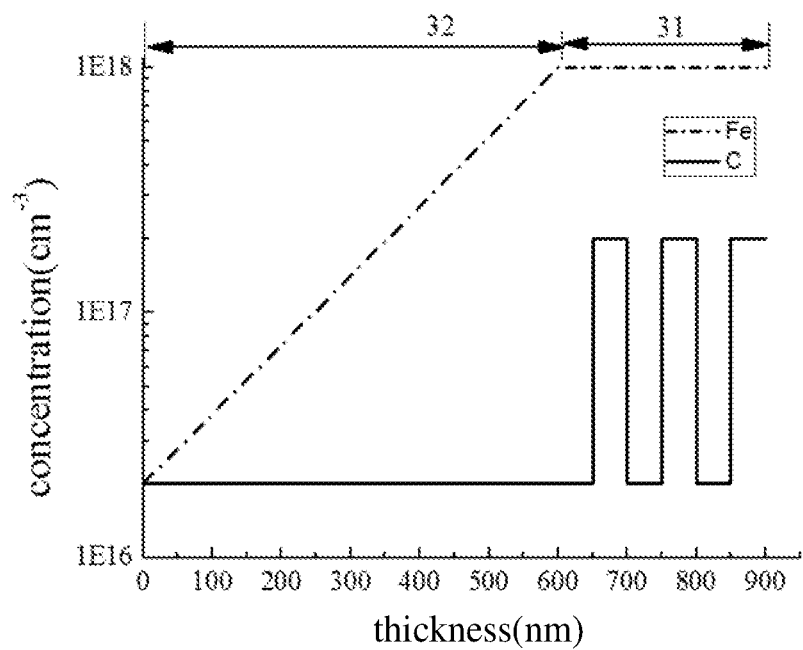

Further, a doping concentration of C may remain constant in the second buffer layer 32. As shown in FIG. 2b, the first buffer layer 31 is doped with the transition metal Fe and the impurity C. The doping concentration of Fe remains constant at $1E18$ $cm^{-3}$. The doping concentration of C is varied periodically, and the peak value of the doping concentration of C is $2E17$ $cm^{-3}$, the valley value of the doping concentration of C is $2E16$ $cm^{-3}$. The second buffer layer 32 is doped with the transition metal Fe and the impurity C. The doping concentration of Fe gradually decreases to $2E16$ $cm^{-3}$, and the doping concentration of C remains constant at $2E16$ $cm^{-3}$.

Figure 2C:
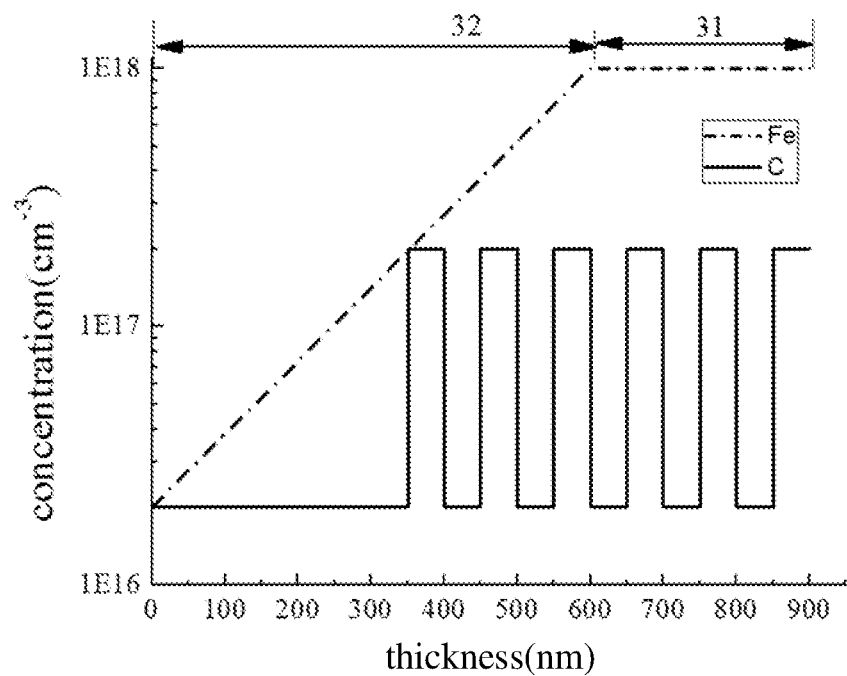

Further, the doping concentration of C may also be varied periodically in part of the second buffer layer 32. As shown in FIG. 2c, the first buffer layer 31 is doped with the transition metal Fe and the impurity C. The doping concentration of Fe remains constant at $1E18$ $cm^{-3}$. The doping concentration of C is varied periodically. The peak value of the doping concentration of C is $2E17$ $cm^{-3}$, and the valley value of the doping concentration of C is $2E16$ $cm^{-3}$. The second buffer layer 32 is doped with the transition metal Fe and the impurity C. The doping concentration of Fe gradually decreases to $2E16$ $cm^{-3}$. The doping concentration of C is varied periodically in part of the second buffer layer 32, and the doping concentration of C remains constant at $2E16$ $cm^{-3}$ in 0 nm to 350 nm. It may be understood that the second buffer layer 32 is doped without C in 0 nm to 350 nm. A doping mode of C in the second buffer layer 32 is not limited, as long as the doping concentration of Fe is not less than the doping concentration of C near the upper surface of the second buffer layer 32 (that is, the upper surface refers to the surface away from the first buffer layer 31).

Figure 2D:
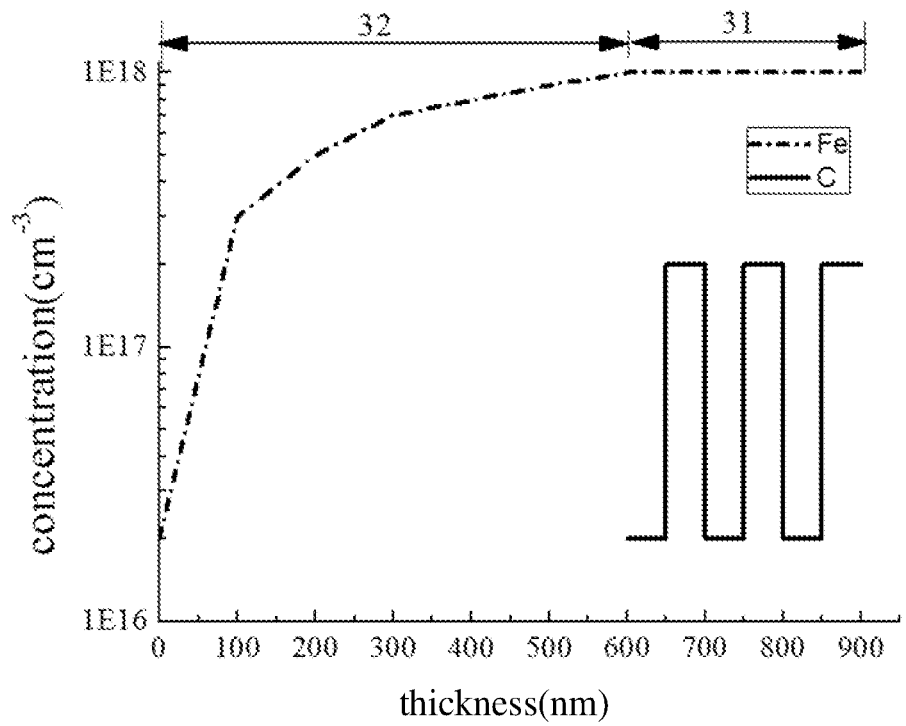

Further, in the second buffer layer 32, decreasing slopes of the doping concentration of Fe is variable. As shown in FIG. 2d, the first buffer layer 31 is doped with the transition metal Fe and the impurity C. The doping concentration of Fe remains constant at 1E18 $cm^{-3}$. The doping concentration of C is varied periodically. The peak value of the doping concentration of C is 2E17 $cm^{-3}$, and the valley value of the doping concentration of C is 2E16 $cm^{-3}$. In the second buffer layer 32, the doping concentration of Fe decreases from 1E18 $cm^{-3}$ at 600 nm to 9E17 $cm^{-3}$ at 500 nm, and then to 7E17 $cm^{-3}$ at 300 nm, 5E17 $cm^{-3}$ at 200 nm and 3E17 $cm^{-3}$ at 100 nm in turn, and finally to 2E16 $cm^{-3}$ in the upper surface of the second buffer layer 32.

It can be understood that a minimum doping concentration and the decreasing slopes of the doping concentration of Fe in the second buffer layer 32 may be affected by factors such as temperature of manufacturing environment, the thickness of the buffer layer, bond energy of the doped transition metal, diffusion activation energy of the doped buffer layer, the doping modes of metals, and dislocation density between the buffer layer and the substrate layer. Therefore, a decreasing trends, a decreasing mode and a decreasing process of the doping concentration of Fe in the second buffer layer 32 are not specifically limited in the present application, as long as the doping concentration of Fe decreases along the direction away from the substrate, the decreasing trend and the decreasing slopes increase larger and larger.

Figure 2E:
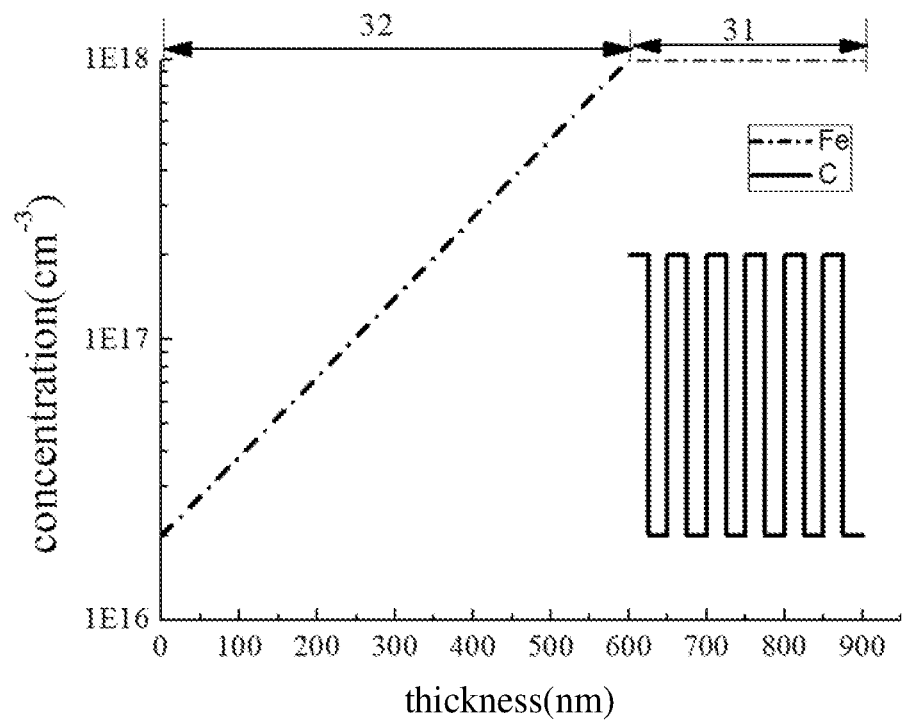

It can be understood that a doping period of the impurity C is not constant. As shown in FIGS. 2a-2d, doping of the impurity C takes a thickness of 100 nm as a period. As shown in FIG. 2e, the doping of the impurity C takes a thickness of 50 nm as a period.

Figure 2F:
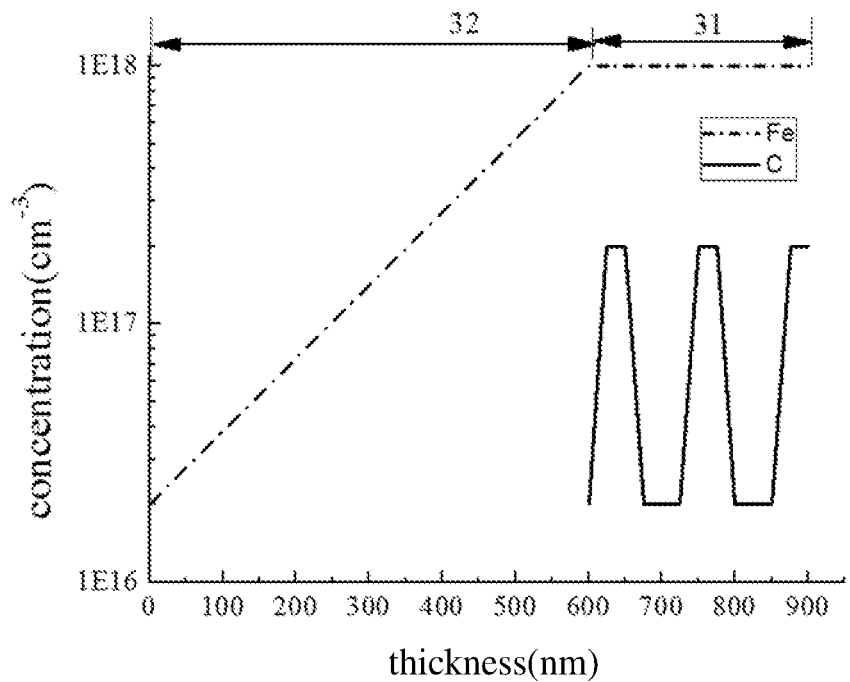
Figure 2G:
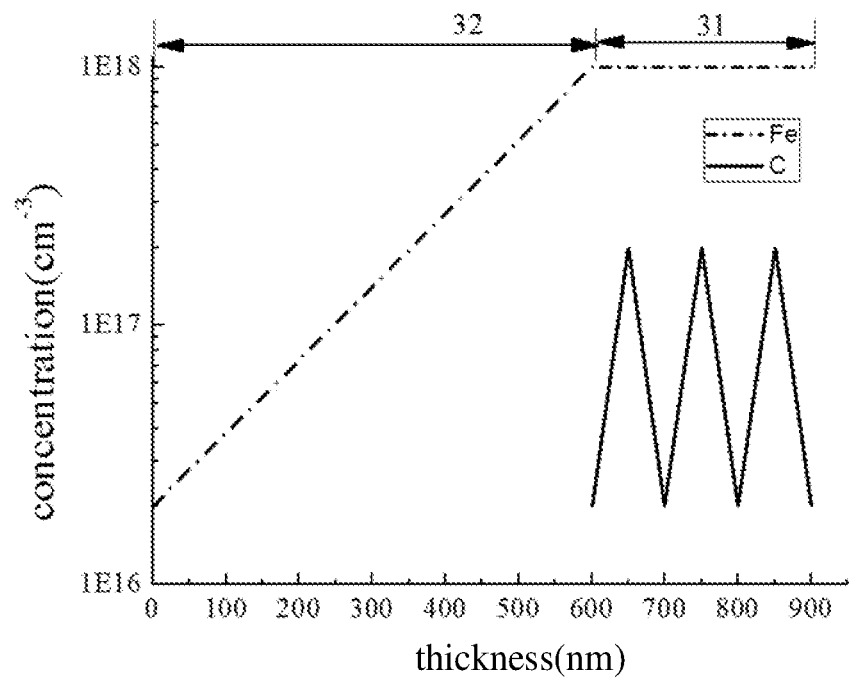
Figure 2H:
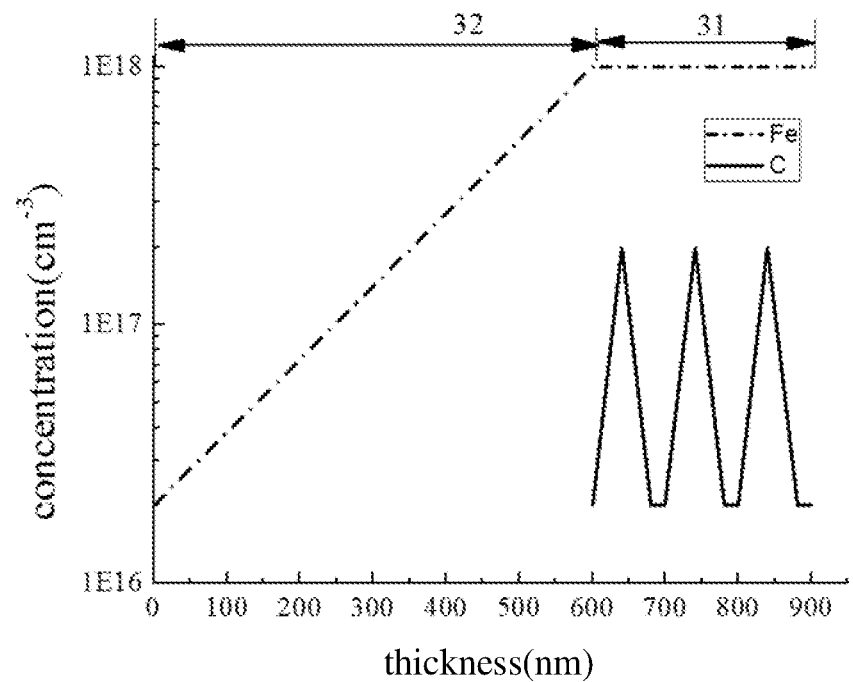

In the above embodiments, the doping concentration of the impurity C in the buffer layer changes with the thickness to present a rectangular shape periodic modulation. In other embodiments, the doping concentration of the impurity C in the buffer layer changes with the thickness to present a periodic modulation of a trapezoid shape (as shown in FIG. 2f) or a triangle shape (as shown in FIG. 2g) or a combination thereof (as shown in FIG. 2h). It can be understood that the shape presented by the periodic modulation is not limited in the present application, as long as the impurity in the first buffer layer 31 is doped periodically.

Further, the described manufacturing method may be realized according to one or a combination of modes such as Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Physical Vapor Deposition (PVD), Metal-Organic Molecular Beam Epitaxy (MOMBE) and Metal-Organic Chemical Vapor Deposition (MOCVD).

Figure 3:
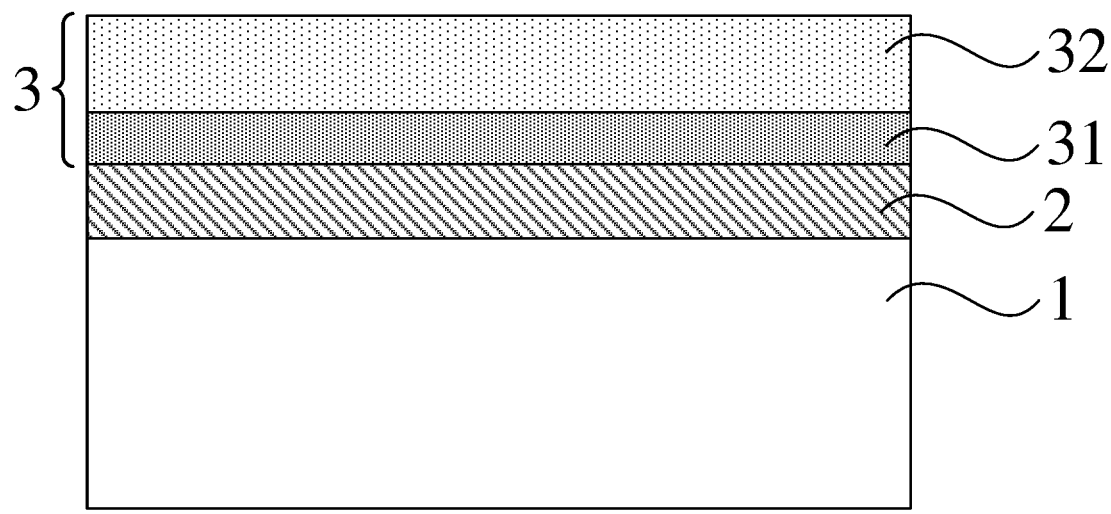
FIG. 3 shows a schematic structural diagram of a semiconductor structure according to another embodiment of the present application.

Further, as shown in FIG. 3, the manufacturing method for the semiconductor structure further includes forming a nucleating layer 2 between the substrate 1 and the buffer layer 3. The nucleating layer 2 is made of one of AlN, GaN and AlGaN.

As shown in FIG. 3, a schematic diagram of a semiconductor structure is provided according to an embodiment of the present application. The semiconductor structure includes a substrate 1 and a buffer layer 3 disposed on the substrate 1. The buffer layer 3 includes a first buffer layer 31 and a second buffer layer 32 upward from the substrate in turn.

The first buffer layer 31 is co-doped with a transition metal and an impurity. A doping concentration of the transition metal remains constant, and a doping concentration of the impurity is periodically modulated.

A peak value of the doping concentration of the impurity modulated periodically is not less than 1E17 $cm^{-3}$, and a valley value is not greater than 50% of the peak value. For example, the valley value of the doping concentration of the impurity modulated periodically is not greater than 5E16 $cm^{-3}$. Further, the valley value of the doping concentration of the impurity modulated periodically is not greater than 3E16 $cm^{-3}$. The impurity, in the first buffer layer 31, is used as an acceptor impurity to compensate background electrons introduced by other impurities (such as oxygen). Additionally, growth conditions such as low pressure and low temperature are needed for achieving the high doping concentration of the impurity. However, a large number of dislocations may be introduced by the growth conditions. Therefore, the dislocations of the buffer layer may be effectively reduced by doping the impurity periodically.

Further, in the first buffer layer 31, the doping concentration of the transition metal is not less than the peak value of the doping concentration of the impurity. The transition metal forms a deep level trap in the buffer layer to capture the background electrons.

Further, the second buffer layer 32 is doped with a transition metal, and a doping concentration of the transition metal in the second buffer layer 32 is less than the doping concentration of the transition metal in the first buffer layer 31.

Further, the doping concentration of the transition metal in the second buffer layer 32 decreases along a direction away from the substrate 1, so as to avoid a tailing effect caused by the transition metal, and prevent current collapse. A minimum doping concentration of the transition metal in the second buffer layer 32 is not greater than 3E16 $cm^{-3}$, otherwise a deep level trap formed by the transition metal with the excessively high doping concentration may cause impurity scattering and reduce mobility.

Further, the semiconductor structure further includes an impurity doped in the second buffer layer 32. A doping concentration of the impurity is not greater than the doping concentration of the transition metal in the second buffer layer 32.

Further, the transition metal includes at least one of Ti, Cr, Mn, Fe, Co, Ni, Cu, Zn, Mo, Ag and Cd, preferably, Fe. The impurity is C.

Further, a thickness of the first buffer layer 31 is 0.01 μm to 5 μm. A thickness of the second buffer layer 32 is 0.05 μm to 5 μm.

In the embodiments, the semiconductor structure may further include the nucleating layer 2 disposed between the substrate 1 and the buffer layer 3 to reduce dislocation density and defect density, and prevent remelting.

The semiconductor structure may be applied to various device structures, such as high electron mobility transistor, high electron mobility transistor including a heterojunction formed by aluminum gallium indium nitrogen and gallium nitride, high mobility triode including a heterojunction formed by aluminum nitride and gallium nitride, gallium nitride Metal-Oxide-Semiconductor Field-Effect Transistor (MOSFET), Light Emitting Diode (LED), photodetector, hydrogen generator and solar cell. For example, if the semiconductor structure is applied to a LED device, a light-emitting structure may be manufactured on the semiconductor structure. If the semiconductor structure is applied to a HEMT device, a heterojunction structure may be epitaxially grown on the semiconductor structure, as shown in FIG. 4.

Figure 4:
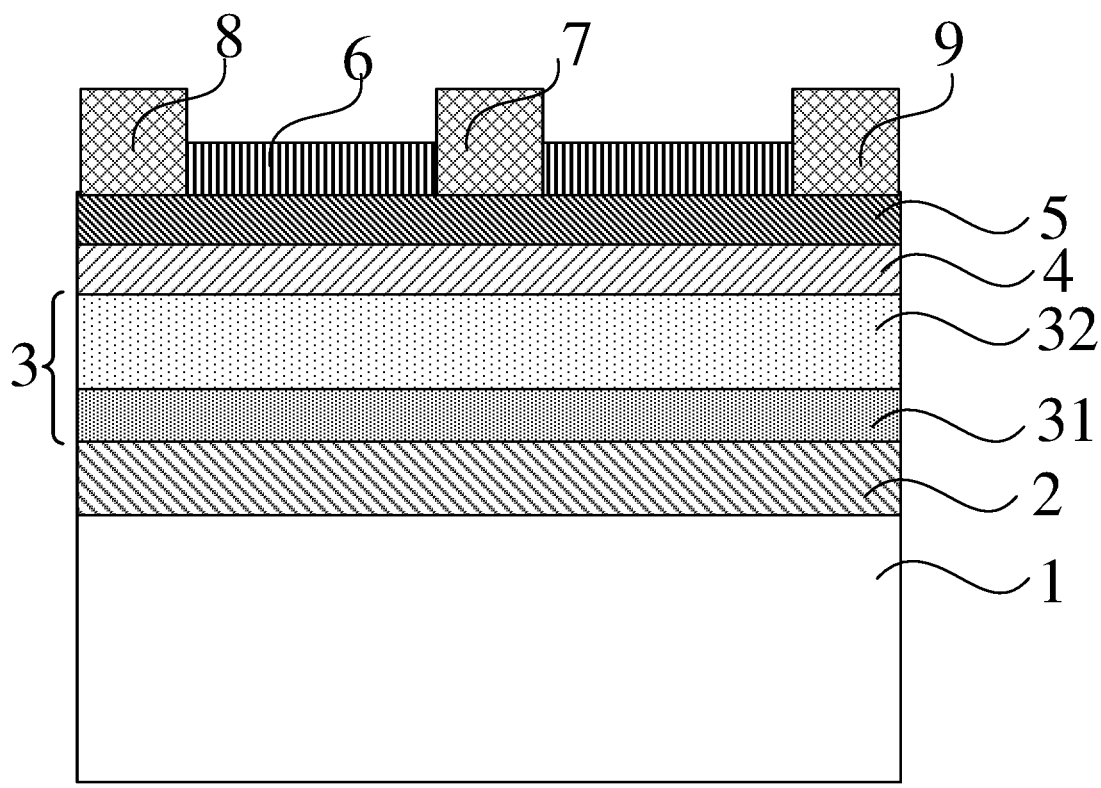
FIG. 4 shows a schematic structural diagram of a HEMT device configured with a semiconductor structure according to an embodiment of the present application.

FIG. 4 shows a schematic structural diagram of a HEMT device configured with a semiconductor structure. The HEMT device includes a substrate 1, a nucleating layer 2, a buffer layer 3, a channel layer 4, a barrier layer 5, a passivation layer 6, a gate electrode 7, a source electrode 8 and a drain electrode 9. The buffer layer 3 includes a first buffer layer 31 and a second buffer layer 32.

In the embodiment, the substrate 1 may be a Si substrate. In other embodiments, the substrate 1 may also be a sapphire substrate or a SiC substrate.

In the embodiment, the nucleating layer 2 is made of AlN, the buffer layer 3 is made of AlGaN, the channel layer 4 is made of GaN, and the barrier layer 5 is made of AlGaN. 2DEG is formed at an interface between the channel layer 4 and the barrier layer 5.

In the embodiment, the passivation layer 6 may include at least one of silicon nitride, silicon dioxide, aluminum nitride, aluminum oxide, aluminum nitride oxide.

In the embodiment, ohmic contact is formed by the source electrode 8, the drain electrode 9 and the barrier layer 5. Schottky contact is formed by the gate electrode 7 and the passivation layer 6.

In the embodiment, the first buffer layer 31 is co-doped with a transition metal and an impurity. A doping concentration of the transition metal remains constant, and a doping concentration of the impurity is modulated periodically. The doping concentration of the transition metal is greater than the doping concentration of the impurity. The second buffer layer 32 is doped with a transition metal. A doping concentration of the transition metal in the second buffer layer 32 is less than the doping concentration of the transition metal in the first buffer layer 31. The doping concentration of the transition metal in the second buffer layer 32 decreases along a direction away from the substrate 1.

Figure 5:
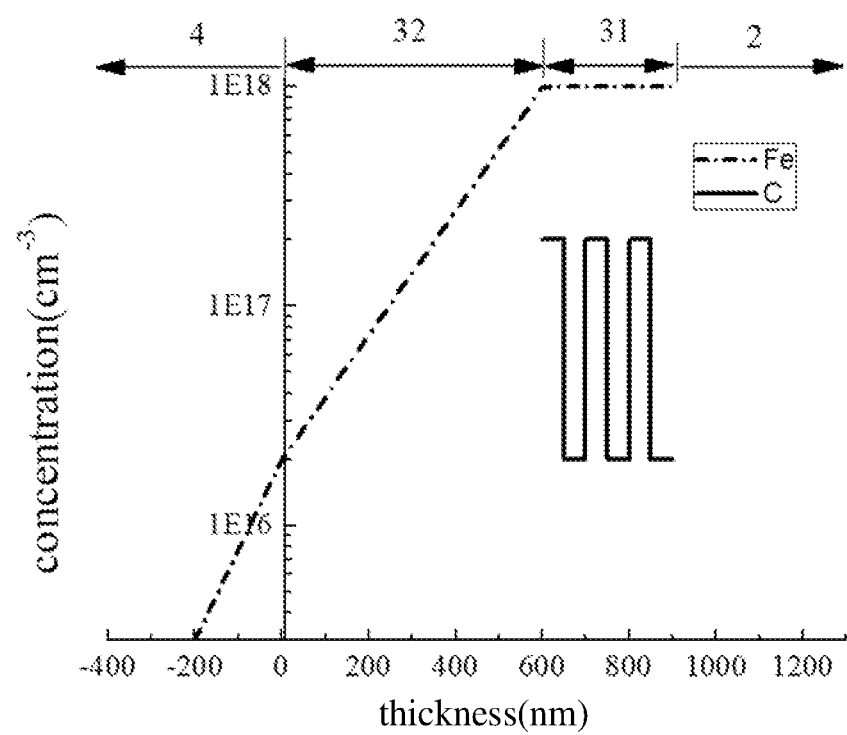
FIG. 5 shows a doping mode of doping concentrations of a transition metal and an impurity in the HEMT device shown in FIG. 4.

Specifically, as shown in FIG. 5, a horizontal axis represents a thickness of a semiconductor layer. An upper surface of the second buffer layer 32 is taken as 0 nm. The upper surface of the second buffer layer 32 is a surface of the second buffer layer 32 away from the substrate 1. A vertical axis represents doping concentrations of doping atoms. In the embodiment, a negative axis direction of the vertical axis refers to a direction of the channel layer. 0 nm to 600 nm in the horizontal axis refers to the second buffer layer 32, 600 nm to 900 nm in the horizontal axis refers to the first buffer layer 31, and greater than 900 nm in the horizontal axis refers to the nucleating layer. In the embodiment, the first buffer layer 31 is doped with the transition metal Fe and the impurity C. A doping concentration of Fe remains constant at 1E18 $cm^{-3}$. In the first buffer layer made of AlGaN, Fe forms a deep acceptor energy level, and forms electrical traps to capture background electrons. In addition, diffusion of free electrons in 2DEG toward the substrate may also be effectively avoided. The doping concentration of C is varied periodically. A peak value of the doping concentration of C is 2E17 $cm^{-3}$, and a valley value of the doping concentration of C is 2E16 $cm^{-3}$. In the second buffer layer 32, the doping concentration of Fe decreases gradually to 2E16 $cm^{-3}$. Fe is stopped doping at the upper surface (0 nm) of the second buffer layer 32. That is, the doping concentration of Fe decreases rapidly.

In technical solutions of the embodiments, by doping the transition metal in the first buffer layer of the semiconductor structure, the deep level trap may be formed to capture the background electrons. In addition, the diffusion of the free electrons toward the substrate may also be effectively avoided. By reducing the doping concentration of the transition metal in the second buffer layer, a tailing effect may be avoided and current collapse may be prevented. By doping periodically the impurity in the buffer layer, the impurity may be as an acceptor impurity to compensate the background electrons, and then a concentration of the background electrons is reduced. By using the periodic doping method, dislocations, caused by doping, in the buffer layer may be effectively reduced.

It may be understood that although the specification is described in accordance with the embodiments, not each of the embodiments only includes one independent technical solution. This narration manner in the specification is only for clarity. Those skilled in the art may regard the specification as a whole, and technical solutions in various embodiments may also be appropriately combined to form other embodiments that can be understood by those skilled in the art.

Also, unless otherwise required by context, singular terms shall include pluralities and plural terms shall include the singular.

The series of detailed descriptions listed above are only specific descriptions of feasible implementations of the present application, and are not used to limit the protection scope of the present application. Any equivalent implementation or modification made within the technical and spirit of the present application shall be included in the protection scope of the present application.

What is claimed is:

1. A semiconductor structure, comprising:
   a substrate;
   a buffer layer disposed on the substrate;
   wherein the buffer layer comprises a first buffer layer and a second buffer layer upward from the substrate in turn,
   the first buffer layer is co-doped with a transition metal and an impurity, a doping concentration of the transition metal in the first buffer layer remains constant, and a doping concentration of the impurity in the first buffer layer is modulated periodically,
   the second buffer layer is doped with a transition metal, and a doping concentration of the transition metal in the second buffer layer is less than the doping concentration of the transition metal in the first buffer layer, and
   the doping concentration of the transition metal in the first buffer layer is not less than a peak value of the doping concentration of the impurity in the first buffer layer.

2. The semiconductor structure according to claim 1, further comprising an impurity doped in the second buffer layer, wherein a doping concentration of the transition metal in an upper surface of the second buffer layer is not less than a doping concentration of the impurity in the upper surface of the second buffer layer, and the upper surface of the second buffer layer refers to a surface of the second buffer layer away from the substrate.

3. The semiconductor structure according to claim 1, wherein the doping concentration of the transition metal in the second buffer layer decreases along a direction away from the substrate.

4. The semiconductor structure according to claim 1, wherein the peak value of the doping concentration of the impurity modulated periodically in the first buffer layer is not less than 1E17 $cm^{-3}$, and a valley value of the doping concentration of the impurity modulated periodically in the first buffer layer is not greater than 50% of the peak value.

5. The semiconductor structure according to claim 1, wherein a valley value of the doping concentration of the impurity modulated periodically in the first buffer layer is not greater than 5E16 cm$^{-3}$ or 3E16 cm$^{-3}$.

6. The semiconductor structure according to claim 1, wherein doping of the impurity in the first buffer layer takes a thickness of 100 nm or 50 nm as a period.

7. The semiconductor structure according to claim 1, wherein the doping concentration of the impurity in the first buffer layer changes with a thickness of the first buffer layer to present a periodic modulation of one or a combination of a rectangular shape, a trapezoid shape and a triangle shape.

8. The semiconductor structure according to claim 1, further comprising a nucleating layer disposed between the substrate and the buffer layer.

9. The semiconductor structure according to claim 8, wherein the nucleating layer is made of one of AlN, GaN and AlGaN.

10. The semiconductor structure according to claim 1, wherein a minimum doping concentration of the transition metal in the second buffer layer is not greater than 3E16 cm$^{-3}$.

11. The semiconductor structure according to claim 1, wherein the transition metal comprises at least one of Ti, Cr, Mn, Fe, Co, Ni, Cu, Zn, Mo, Ag and Cd.

12. The semiconductor structure according to claim 1, wherein the impurity is C.

13. The semiconductor structure according to claim 1, wherein a thickness of the first buffer layer is 0.01 μm to 5 μm, and a thickness of the second buffer layer is 0.05 μm to 5 μm.

14. The semiconductor structure according to claim 1, wherein the substrate is made of at least one of semiconductor materials, ceramic materials and polymer materials.

15. A manufacturing method for a semiconductor structure, comprising:
providing a substrate;
forming a buffer layer disposed on the substrate;
wherein the buffer layer comprises a first buffer layer and a second buffer layer upward from the substrate in turn, the first buffer layer is co-doped with a transition metal and an impurity, a doping concentration of the transition metal in the first buffer layer remains constant, and a doping concentration of the impurity in the first buffer layer is modulated periodically,
the second buffer layer is doped with a transition metal, and a doping concentration of the transition metal in the second buffer layer is less than the doping concentration of the transition metal in the first buffer layer, and
the doping concentration of the transition metal in the first buffer layer is not less than a peak value of the doping concentration of the impurity in the first buffer layer.

16. The manufacturing method for the semiconductor structure according to claim 15, further comprising:
doping an impurity in the second buffer layer;
wherein a doping concentration of the transition metal in an upper surface of the second buffer layer is not less than a doping concentration of the impurity in the upper surface of the second buffer layer, and the upper surface of the second buffer layer refers to a surface of the second buffer layer away from the substrate.

17. The manufacturing method for the semiconductor structure according to claim 15, further comprising:
forming a nucleating layer between the substrate and the buffer layer.

18. The manufacturing method for the semiconductor structure according to claim 15, wherein the doping concentration of the transition metal in the second buffer layer decreases along a direction away from the substrate.

19. The manufacturing method for the semiconductor structure according to claim 15, wherein the peak value of the doping concentration of the impurity modulated periodically in the first buffer layer is not less than 1E17 cm$^{-3}$, and a valley value of the doping concentration of the impurity modulated periodically in the first buffer layer is not greater than 50% of the peak value.

20. The manufacturing method for the semiconductor structure according to claim 15, wherein a minimum doping concentration of the transition metal in the second buffer layer is not greater than 3E16 cm$^{-3}$.

* * * * *